United States Patent [19]
Irlbeck et al.

[11] Patent Number: 5,456,018
[45] Date of Patent: Oct. 10, 1995

[54] ALIGNMENT SYSTEM FOR PLANAR ELECTRONIC DEVICES ARRANGED IN PARALLEL FASHION

[75] Inventors: Robert D. Irlbeck, Greensboro, N.C.; Soren Grinderslev, Hummelstown, Pa.; William W. Drabenstadt, Camp Hill, Pa.; Richard C. Fowler, East Berlin, Pa.

[73] Assignee: The Whitaker Corporation, Wilmington, Del.

[21] Appl. No.: 204,025

[22] Filed: Feb. 28, 1994

[51] Int. Cl.⁶ .................................................. B32B 3/06
[52] U.S. Cl. .................................................. 33/645; 33/613
[58] Field of Search ........................... 33/613, 645, 620, 33/621, 623, 644; 29/834; 439/70, 71, 72, 73, 68

[56] References Cited

U.S. PATENT DOCUMENTS

| | | | |
|---|---|---|---|
| 4,356,223 | 10/1982 | Iida et al. | 33/613 X |
| 4,458,968 | 7/1984 | Madden | 439/71 |
| 4,565,314 | 1/1986 | Scholz | 29/834 X |
| 4,670,981 | 6/1987 | Kubota et al. | 33/613 X |
| 4,705,205 | 11/1987 | Allen et al. | 439/70 X |
| 5,092,033 | 3/1992 | Nishiguchi et al. | 29/834 X |
| 5,177,326 | 1/1993 | Goldhammer | 29/829 X |
| 5,227,959 | 7/1993 | Rubinstein et al. | 439/71 X |

*Primary Examiner*—Alvin Wirthlin
*Attorney, Agent, or Firm*—William B. Noll; Timothy J. Aberle

[57] ABSTRACT

This invention is directed to a system for precisely aligning a pair of electronic devices, such as an integrated chip test socket electrically interconnected to a motherboard, where such devices are arranged in a parallel relationship. The system includes a method which comprises the steps of fixedly securing plural projections on a planar surface of each of the devices, where each projection includes a flat side or edge and that the flat side of at least two adjacent projections define a first plane or reference line. Arranging the respective planar surfaces in close proximity to one another whereby the projections from one surface contacts the other planar surface. Thereafter, shifting the respective devices relative to one another until the respective first planes or reference lines are aligned into a common plane or line. Finally the devices are fixedly secured together, whereby the electrical interconnections between the devices are precisely aligned.

5 Claims, 5 Drawing Sheets

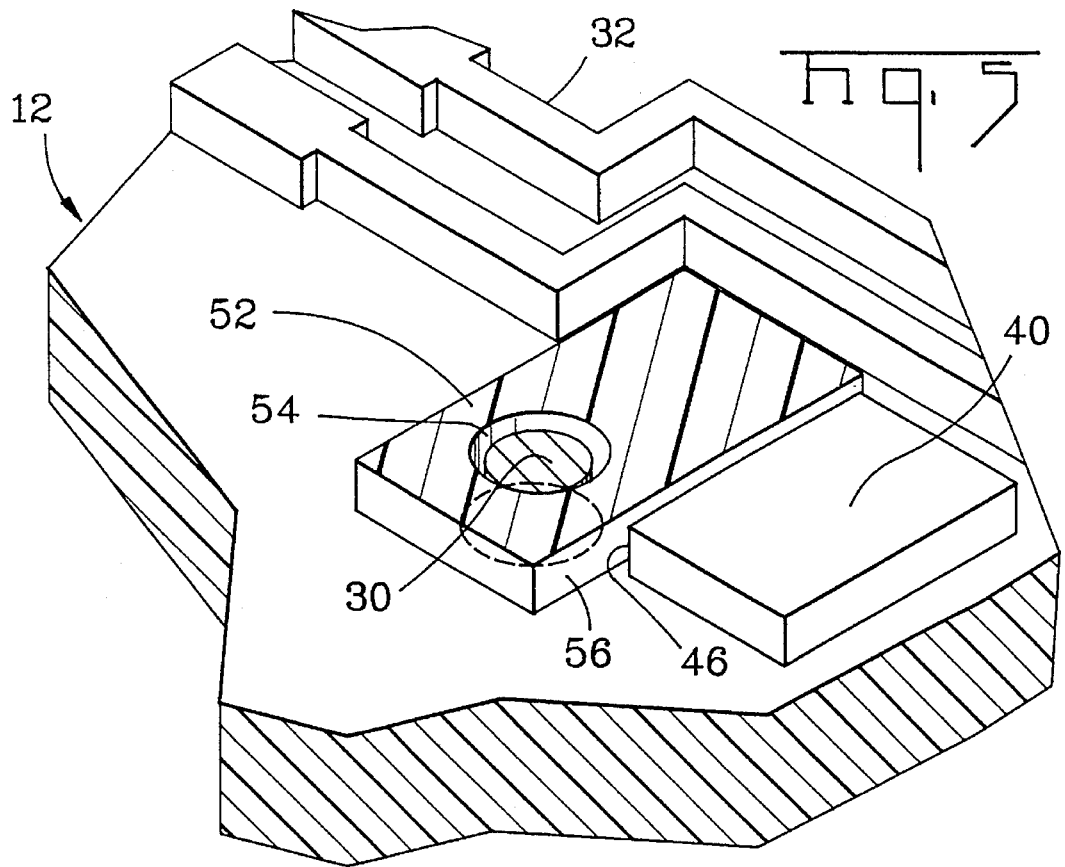
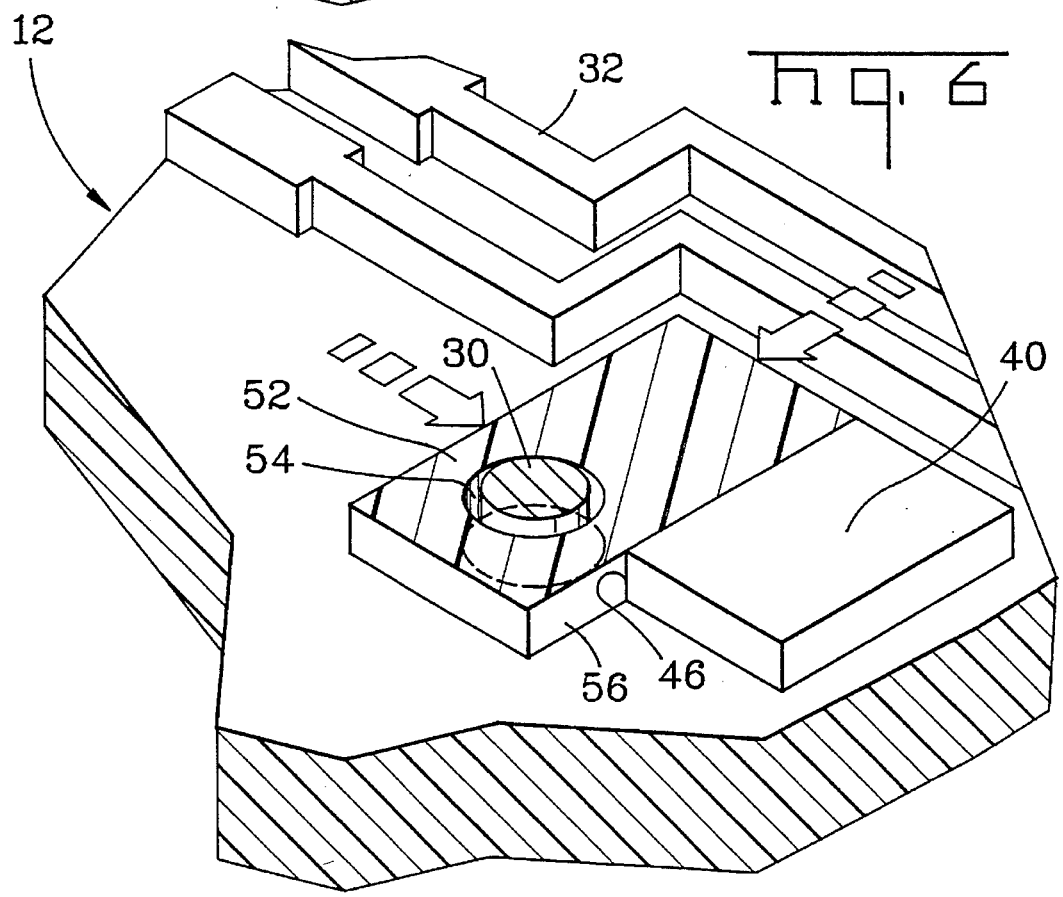

5,456,018

ALIGNMENT SYSTEM FOR PLANAR ELECTRONIC DEVICES ARRANGED IN PARALLEL FASHION

RELATED APPLICATION

This invention represents an improvement to the system for precisely aligning an integrated chip test socket, of the type disclosed in copending application, U.S. Ser. No. 08/193,347, filed Feb. 8, 1994, to a planar electronic device, such as a motherboard.

BACKGROUND OF THE INVENTION

In the copending application there is taught a socket testing apparatus, such as a burn-in test socket, for integrated circuit "chips". While the invention hereof is not limited to the use of a burn-in test socket, it nevertheless represents an ideal situation where precise alignment of the test socket to a planar electronic device, such as a motherboard, is required.

In the case of a burn-in test socket, to precipitate early chip failure, if there is going to be a failure, the chip is "exercised" or powered while being subjected to relatively high external temperatures. Typically, a batch of chips is electrically powered in an oven where the temperature is maintained at approximately 150° C. for an extended period of time, such as 1,000 hours. This is referred to in the art as "burn-in".

During burn-in, a batch of chips may be mounted on a mother board, and the chip leads are electrically connected to respective circuit elements on the mother board by a suitable means, such as one or more flexible electrical connectors. Maintaining good and reliable electrical contact between the chip leads and the flexible electrical connector is very important. The copending application represents one way of maintaining a proper force between the chip socket and the mother board by the use of a spring-loaded floating cover member. However, one of the difficulties encountered in mating the chip leads to the circuit elements or pads of the motherboard lies in the alignment of the respective components, particularly with fine, highly dense circuit and pad spacings. That is, the task of aligning the device leads with the board pads via a socket becomes increasingly difficult as the centerline distance and lead size become smaller. Typically the alignments of the device-to-socket and the socket-to-board are done by a hole/pin arrangement. The mechanical size and position tolerance build-up will be the limiting factors in such an assembly.

The present invention avoids the difficulties or problems of the prior methods by a system which takes advantage of the extremely precise photo etching process which is used for the manufacturing of the traces and pads on a printed circuit board. As will be apparent in the description which follows, dimensioning and manufacturing of the socket and board are done from two perpendicular lines or planes which are dedicated as origins or datum lines. It is now understood that ideal alignment between the two devices will occur when the datum lines from the socket overlap those from the board within the allowable tolerance range. This concept completely eliminates the need for the use of a hole/pin alignment between the socket and the board. The unique system of this invention is equivalent to a tolerance reduction of about 75%. This will become clearer in the following specification, particularly when read in conjunction with the accompanying drawings.

SUMMARY OF THE INVENTION

This invention is directed to a system, such as a method and the product thereof, for the precision alignment of a pair of electronic devices, typically an integrated chip test socket electrically interconnected to a motherboard, where such devices are arranged in a parallel relationship. The system includes a method which comprises the steps of fixedly securing plural projections, such as by integrally molding, fastening, or circuit plating, on a planar surface of each of the devices, where each projection includes a flat side or edge and that the flat side of at least two adjacent projections define a first plane or reference line.

Arranging the respective planar surfaces in close proximity to one another whereby the projections from one surface contacts the other planar surface. Thereafter, shifting the respective devices relative to one another until the respective first planes or reference lines are aligned into a common plane or line. Finally the devices are fixedly secured together, whereby the electrical interconnections between the devices are precisely aligned.

BRIEF DESCRIPTION OF DRAWINGS

FIG. 5 is an enlarged, partial perspective view of a pair of stop pads, one from each planar electronic device, in the preliminary mounted position of FIG. 3.

FIG. 6 is an enlarged, partial perspective view, similar to FIG. 5, but showing the final mounted position of FIG. 4.

DETAILED DESCRIPTION OF PREFERRED EMBODIMENT

This invention is directed to an improved system for the precise alignment of a pair of electronic devices in a parallel arrangement, where each such device exhibits an essentially planar surface and said devices are assembled with the essentially planar surfaces in close proximity to one another.

Figure 1:
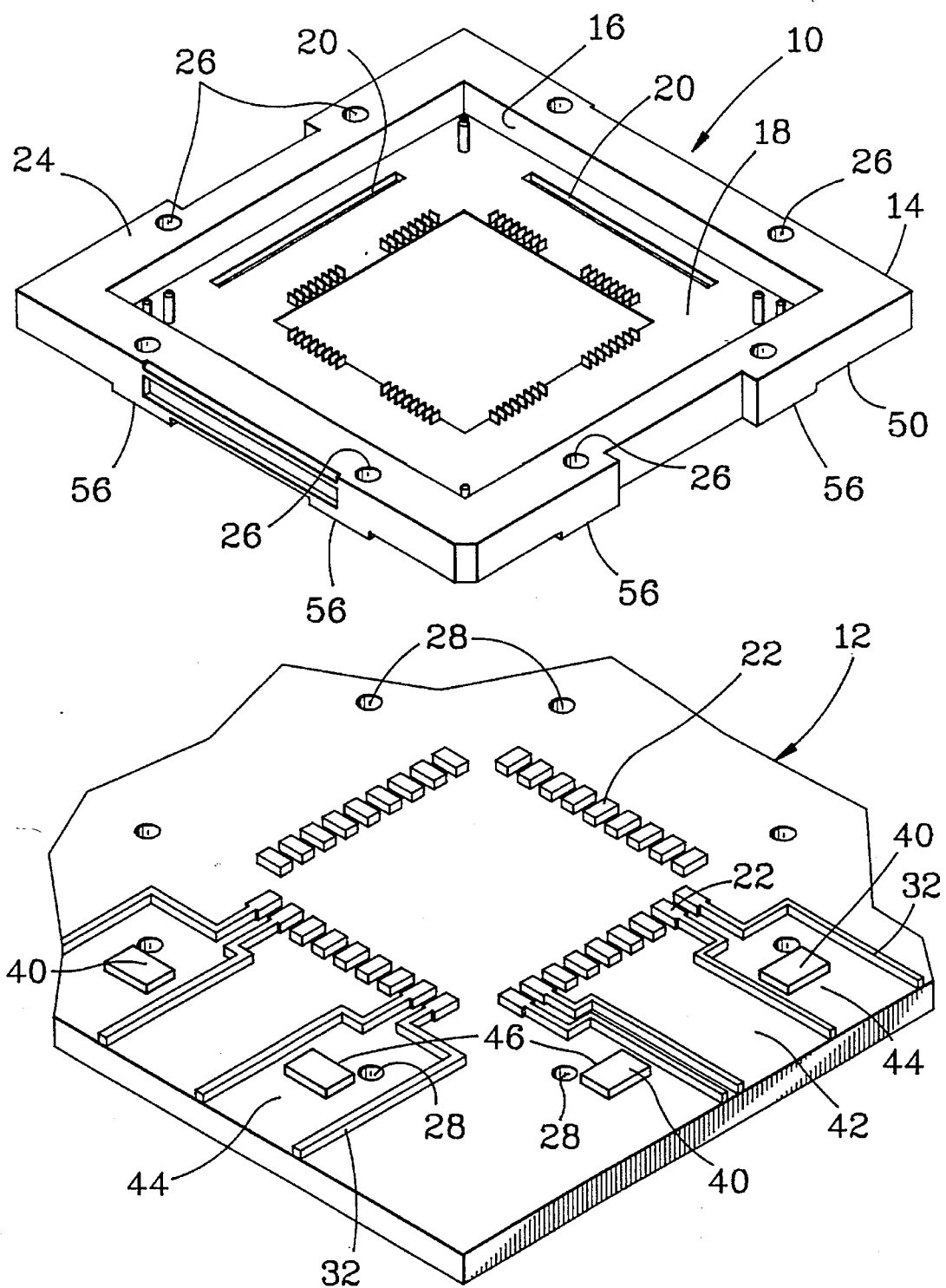
FIG. 1 is an exploded perspective view of a first electronic device, such as a test socket, to be aligned and mounted to a second electronic device by the practice of this invention.

FIG. 1 illustrates a pair of such electronic devices 10, 12 to be aligned in the manner to be described hereinafter. For purposes of an exemplary illustration, the electronic device 10 may comprise a chip test socket of the type described in said co-pending application, where such application is incorporated herein by reference. In FIG. 1, the test socket 10 is only partially illustrated. Typically a test socket of the type contemplated herein includes a base 14, having a centrally disposed internal cavity 16 for receiving a chip (not shown) for testing, and a force applying member (not shown) to secure said chip within the cavity 16 during testing. The cavity surface 18 is provided with plural openings, typically in the form of slots 20, for receiving an elastomeric connector for electrically interconnecting chip leads in contact therewith to corresponding traces or pads 22 on the other electronic device 12, as hereinafter explained. An elastomeric connector of the type contemplated herein is manufactured by AMP Incorporated, Harrisburg, PA, under the registered trademark "AMPLIFLEX", a trademark owned by The Whitaker Corporation. Such elastomeric connectors, intended for surface-to-surface interconnection requirements, consist of an elastomeric core having a thin plastic film thereabout, such as polyimide, where the film is typically provided with parallel lines of etched circuitry thereon for electrically interconnecting one device to another.

Surrounding the cavity 16 is a peripheral wall 24 which includes plural through holes 26 positioned thereabout to be aligned with corresponding through holes 28 in the other device 12. Typically, the test socket 10 is secured by fasteners, designated as 30 in FIGS. 5 and 6, to the other electronic device 12. However, it will be appreciated that due to built-in tolerances between the respective holes 26, 28 and fasteners 30, there will be some play or relative positioning of the respective electronic devices toward one another. That is, the task of precisely aligning the chip leads with the pads 22 via the socket 10 becomes increasingly difficult as the centerline distance and lead size become smaller.

The present invention is particularly suitable for fine, highly dense centerline interconnections. The improvement achieved herein is equivalent to a tolerance reduction of approximately 75%. Returning now to the several Figures, it will be noted that electronic device 12 has been provided with numerous pads 22 and conductive traces 32 extending from certain of such pads. It should be noted for illustration purposes that certain liberties have been taken in illustrating the pads 22 and traces 32. That is, they appear as having a large height relative to the device thickness. In fact, a typical pad 22 or trace 32 is actually about 1.4 mils in height, as known in the art in the manufacture of printed circuit boards, such as illustrated in the Figures as device 12. Such pads and traces are formed by a technique known in the art as photo etching. It is a procedure that is particularly suited for producing fine and precise patterns of circuitry design.

Continuing now to the specific contributions of the present invention, it will be noted that a plurality of stop pads or projections 40 have been strategically provided on the planar surface 42 of electronic device 12. The projections, preferably formed during the photo etching process that produces the circuitry on surface 42, have a like dimensional height as such circuitry. Further, such projections are electrically isolated from the circuitry in an area 44 near the through holes 28. It is noted that the projections 40 are preferably arranged in pairs along adjoining sides of the device 12. A critical feature of each pair of projections is that the respective inwardly facing side walls 46 are well defined and form a reference line or plane, such as the "X" or "Y" directions, as the case may be. In addition to the coupling of the pairs of projections 40, they are located, or at least the respective planes or lines, relative to the circuitry pattern. This is readily achievable by taking advantage of the extremely precise photo etching process used in the manufacture of the traces and pads of the printed circuit board, i.e. electronic device 12.

Figure 2:
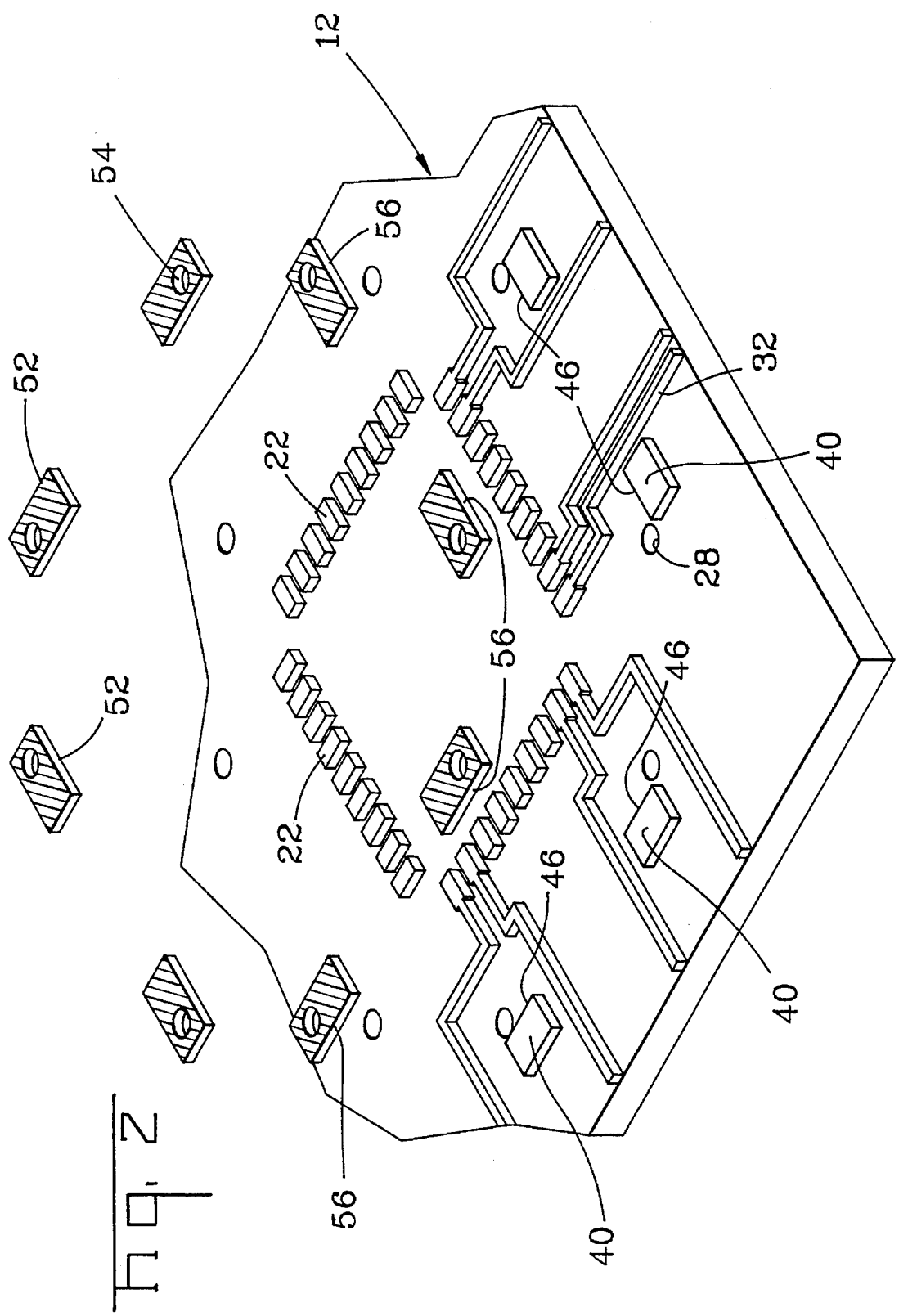
FIG. 2 is a perspective view of an electronic device, such as a motherboard or printed circuit board, illustrating a plurality of sectioned stop pads or projections, taken in a plane through the stop pads of the socket or second electronic device, which are mounted to the surface of said first electronic device.
Figure 3:
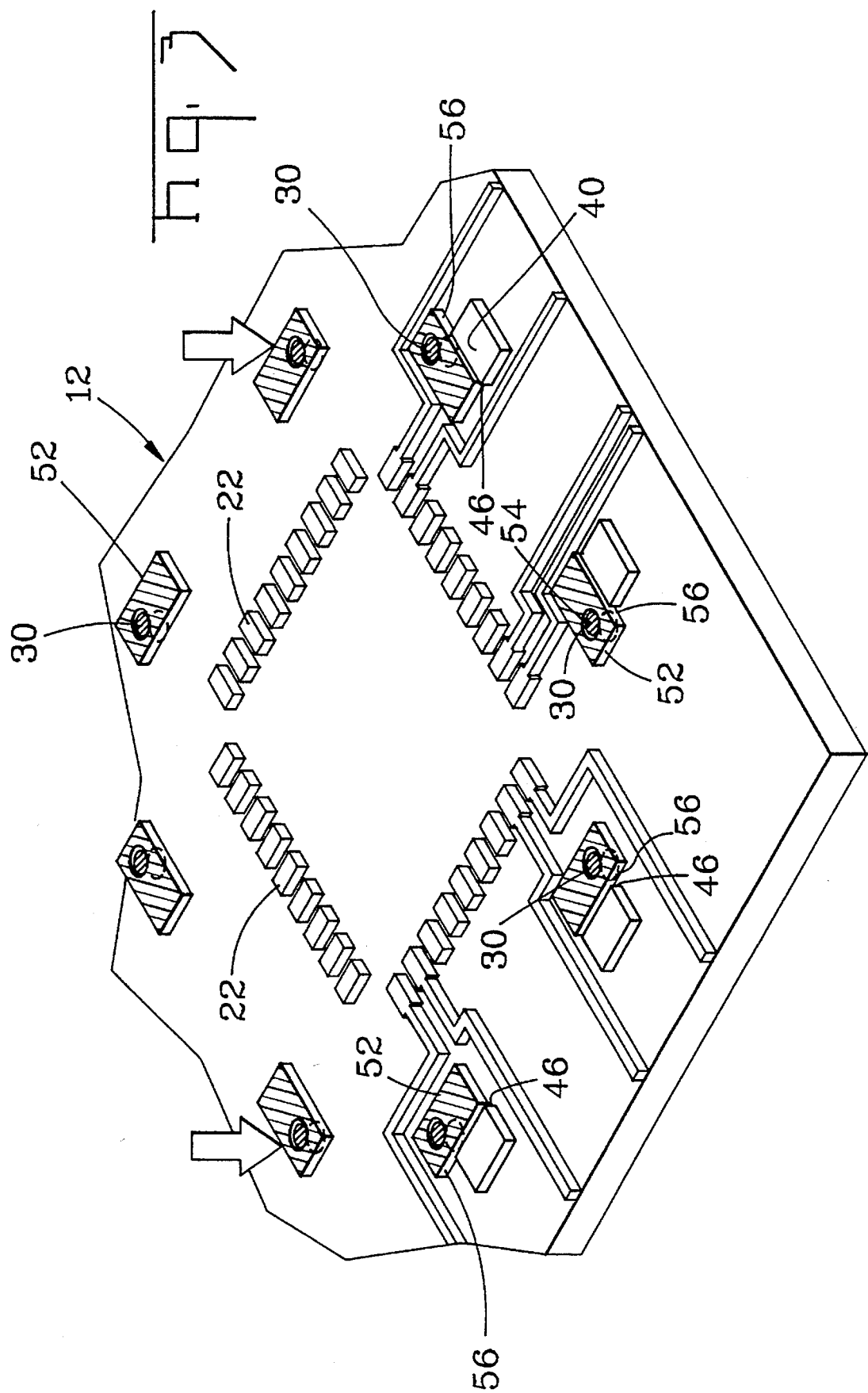
FIG. 3 is a perspective view, similar to FIG. 2, showing the stop pads of the socket or second electronic device preliminarily mounted to said first electronic device.
Figure 4:
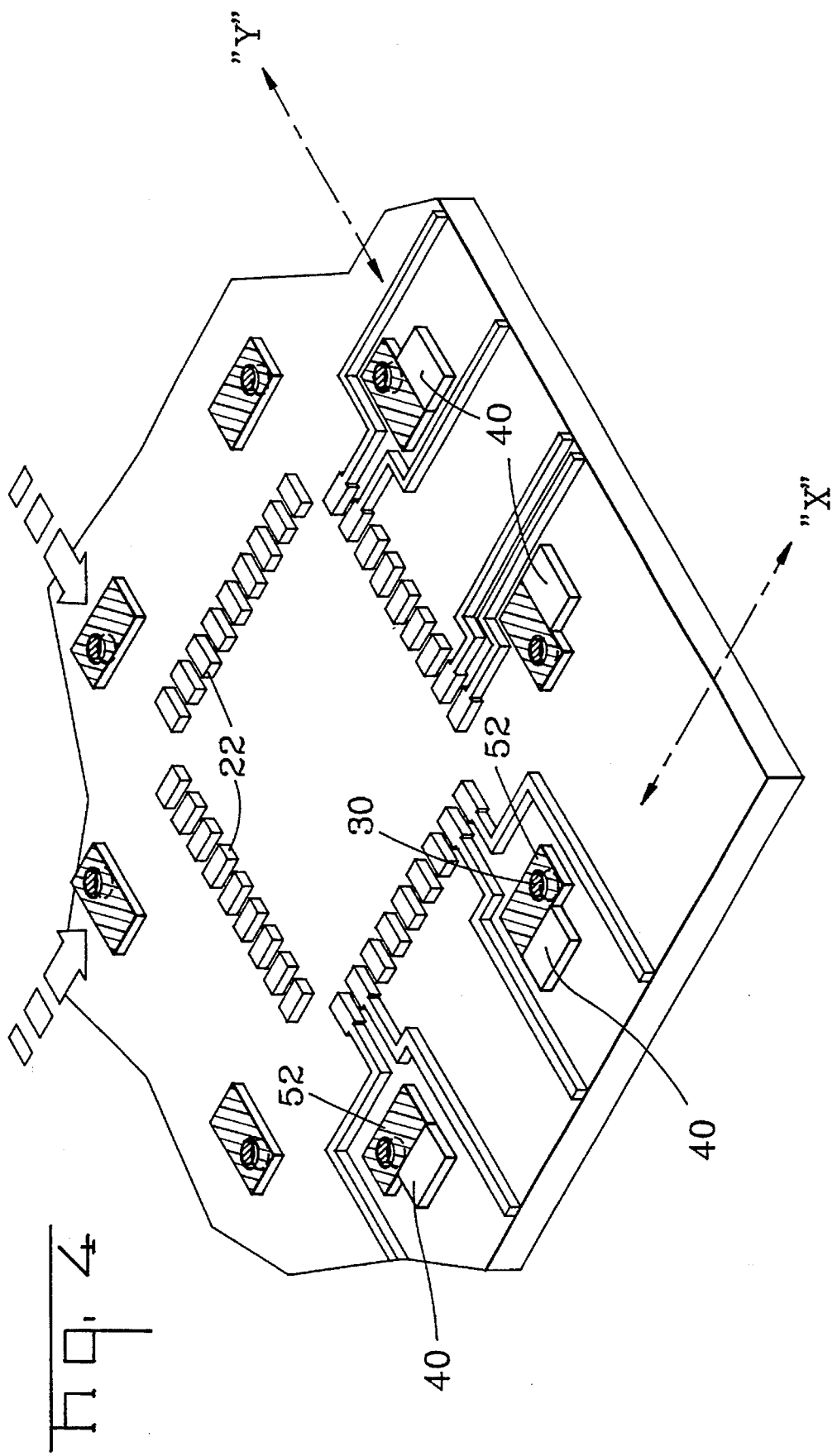
FIG. 4 is a perspective view, similar to FIG. 3, showing a final positioning of certain of the respective stop pads in abutting relationship.

The second or mating electronic device, illustrated as test socket housing 10 in FIG. 1, further includes a lower essentially planar surface 50. Mounted or projecting below from said surface are a plurality of feet or projections 52, see FIG. 2, which may be integrally molded thereto, or fastened, by way of example. To develop FIG. 2, the test socket housing 10 was sectioned just below surface 50 leaving the apparent isolated and separated projections 52 disposed above their mating positions on the surface 42 of electronic device 12. Each said projection 52 includes a through hole 54, aligned with a respective through hole 26 in the peripheral wall 24 of electronic device 10. Additionally, the projections 52 are arranged peripherally about the cavity 16, specifically under the peripheral wall portion 24, in a series of pairs. Each projection includes a sharply defined outwardly facing edge 56, where edges 56 of a respective pair are aligned along a common line or in a plane. At least with regard to the projection pairs (lower four projections illustrated in FIG. 2) which are to mechanically abut with corresponding projections on the other electronic device, the placement thereof is precise relative to the electrical interconnection means, i.e. elastomeric connector in this embodiment within slot 20. The remaining projections 52, the four upper projections in FIG. 2, act to provide balance to the device 10 when mated with or brought into engagement with device 12. FIG. 3 illustrates the projections 52 in their initial contact stage with the respective projections 40 of device 12. In this position, the respective through holes 26 and 28 are generally aligned, at least within the tolerance limits associated with the holes 26, 28. After such preliminary alignment of the respective devices, fasteners 30 are inserted through the holes 26, 28 such that the devices 10, 12 are loosely engaged, see FIGS. 3 and 5. As best illustrated in FIGS. 4 and 6, final alignment is achieved by shifting the electronic device 12 in the X and Y directions, for mechanically abutting, note the direction arrows, whereby the respective lines or planes formed by the sharply defined side walls 46, 56 align in the respective X, Y planes. In this position, the respective devices are precisely aligned, and hence the respective circuitry thereon aligned as desired. Thereafter, fasteners 30 may be finally adjusted to fixedly secure the devices 10, 12 in an engaged relationship.

We claim:

1. An alignment system for aligning engageable electrical system components having respective electrical circuits thereon, comprising:

a first electrical component having a pair of first projections formed thereon and fixed thereto for preventing relative movement between said first electrical component and said first pair of projections, and each of said first projections includes a sidewall having a generally flat, first alignment surface;

a second electrical component having a pair of second projections formed thereon and fixed thereto for preventing relative movement between said second electrical component and said pair of second projections, and each of said second projections includes a sidewall having a generally flat second alignment surface for sliding engagement with a respective said first alignment surface when said first and second electrical components and their respective circuits are brought into engagement and said pairs of first and second alignment surfaces acting in cooperation to align said first and second electrical components; and at least one of said second projections comprises a mass of material disposed adjacent to an electrical circuit trace formed on said second electrical component.

2. The alignment system of claim 1, wherein said mass comprises a block shape.

3. The alignment system of claim 1, wherein said first electrical component comprises at least one hole which extends through at least one of said first projections, and said hole is aligned with a hole formed in said second electrical component for receiving a fastener therethrough.

4. The alignment system of claim 1, wherein at least one of said second projections comprises a photo-etched mass, which comprises a boxlike shape.

5. The alignment system of claim 1, wherein said second electrical component comprises a hole for receiving a fastener therein, and said first electrical component comprises a hole which passes through at least one of said first projections for receiving said fastener therein, and said second electrical component hole is offset from at least one of said second projections.

* * * * *